1

United States Patent
Conti et al.

(10) Patent No.: US 11,302,748 B2
(45) Date of Patent: Apr. 12, 2022

(54) ARRAYS OF MEMORY CELLS AND METHODS OF FORMING AN ARRAY OF ELEVATIONALLY-OUTER-TIER MEMORY CELLS AND ELEVATIONALLY-INNER-TIER MEMORY CELLS

(71) Applicant: Micron Technology, Inc., Boise, ID (US)

(72) Inventors: Anna Maria Conti, Milan (IT); Agostino Pirovano, Milan (IT); Andrea Redaelli, Casatenovo (IT)

(73) Assignee: Micron Technology, Inc., Boise, ID (US)

( * ) Notice: Subject to any disclaimer, the term of this patent is extended or adjusted under 35 U.S.C. 154(b) by 56 days.

(21) Appl. No.: 16/575,743

(22) Filed: Sep. 19, 2019

(65) Prior Publication Data
US 2020/0013829 A1  Jan. 9, 2020

Related U.S. Application Data

(63) Continuation of application No. 15/497,503, filed on Apr. 26, 2017, now Pat. No. 10,461,128.

(51) Int. Cl.
*H01L 27/24* (2006.01)
*H01L 45/00* (2006.01)

(52) U.S. Cl.
CPC ...... *H01L 27/2481* (2013.01); *H01L 27/2409* (2013.01); *H01L 27/2427* (2013.01); *H01L 45/1675* (2013.01)

(58) Field of Classification Search
CPC . H01L 27/2481; H01L 45/1675; H01L 45/16; H01L 27/2427; H01L 45/1666; H01L 27/2409; H01L 27/11514
See application file for complete search history.

(56) References Cited

U.S. PATENT DOCUMENTS

| | | |
|---|---|---|
| 6,177,329 B1 | 1/2001 | Pang |
| 6,436,824 B1 | 8/2002 | Chooi et al. |
| 6,472,335 B1 | 10/2002 | Tsai |
| 6,664,186 B1 | 12/2003 | Callegari |

(Continued)

FOREIGN PATENT DOCUMENTS

WO  WO 2017/078988  5/2017

OTHER PUBLICATIONS

Legtenber et al., "Anisotropic Reactive Ion Etching of Silicon Using SF6/02/CHF3 Gas Mixtures", J. Electrochem. Soc. 1995 vol. 142, issue 6, 2920-2028.

(Continued)

*Primary Examiner* — Marcos D. Pizarro
*Assistant Examiner* — Antonio B Crite
(74) *Attorney, Agent, or Firm* — Wells St. John P.S.

(57) ABSTRACT

A method of forming an array of memory cells, where the array comprises an elevationally-inner tier of memory cells comprising spaced-inner-tier-lower-first-conductive lines and inner-tier-programmable material directly there-above, an elevationally-outer tier of memory cells comprising spaced-outer-tier-lower-first-conductive lines and outer-tier-programmable material directly there-above, and spaced-upper-second-conductive lines that are electrically shared by the outer-tier memory cells and the inner-tier memory cells, comprises depositing conductor material for all of the shared-spaced-upper-second-conductive lines. All of the conductor material for all of the shared-spaced-upper-second-conductive lines is patterned using only a single masking step. Other method embodiments and arrays of memory cells independent of method of manufacture are disclosed.

5 Claims, 10 Drawing Sheets

(56) References Cited

U.S. PATENT DOCUMENTS

| | | |
|---|---|---|
| 6,674,168 B1 | 1/2004 | Cooney, III et al. |
| 8,040,715 B2 | 10/2011 | Takase |
| 8,809,831 B2 | 8/2014 | Herner |
| 8,847,186 B2 | 9/2014 | Redaelli et al. |
| 2002/0172766 A1 | 11/2002 | Laxman et al. |
| 2004/0033631 A1 | 2/2004 | Clark et al. |
| 2006/0268594 A1 | 11/2006 | Toda |
| 2007/0058426 A1 | 3/2007 | Sokolik et al. |
| 2007/0202699 A1 | 8/2007 | Toyoda et al. |
| 2008/0303074 A1 | 12/2008 | Noda |
| 2010/0237042 A1 | 9/2010 | Nguyen |
| 2012/0061744 A1 | 3/2012 | Hwang et al. |
| 2012/0276735 A1 | 11/2012 | Tagami |
| 2015/0069630 A1 | 3/2015 | Sciarrillo |
| 2015/0349255 A1* | 12/2015 | Pellizzer ............... H01L 45/147 257/4 |
| 2016/0049447 A1* | 2/2016 | Jung ................... H01L 27/2481 257/4 |
| 2016/0307963 A1 | 10/2016 | Hineman et al. |
| 2017/0186815 A1 | 6/2017 | Bernhardt et al. |
| 2017/0250339 A1* | 8/2017 | Sim .................... H01L 27/2427 |
| 2017/0338280 A1 | 11/2017 | Frost et al. |

OTHER PUBLICATIONS

Raballand et al., "A model for Si, SiCH, Si02, SiOCH, and porous SiOCH etch rate calculation in inductively coupled fluorocarbon plasma with a pulsed bias: Importance of the fluorocarbon layer", Journal of Applied Physics 102, 063306 2007. pp. 1-8.

\* cited by examiner

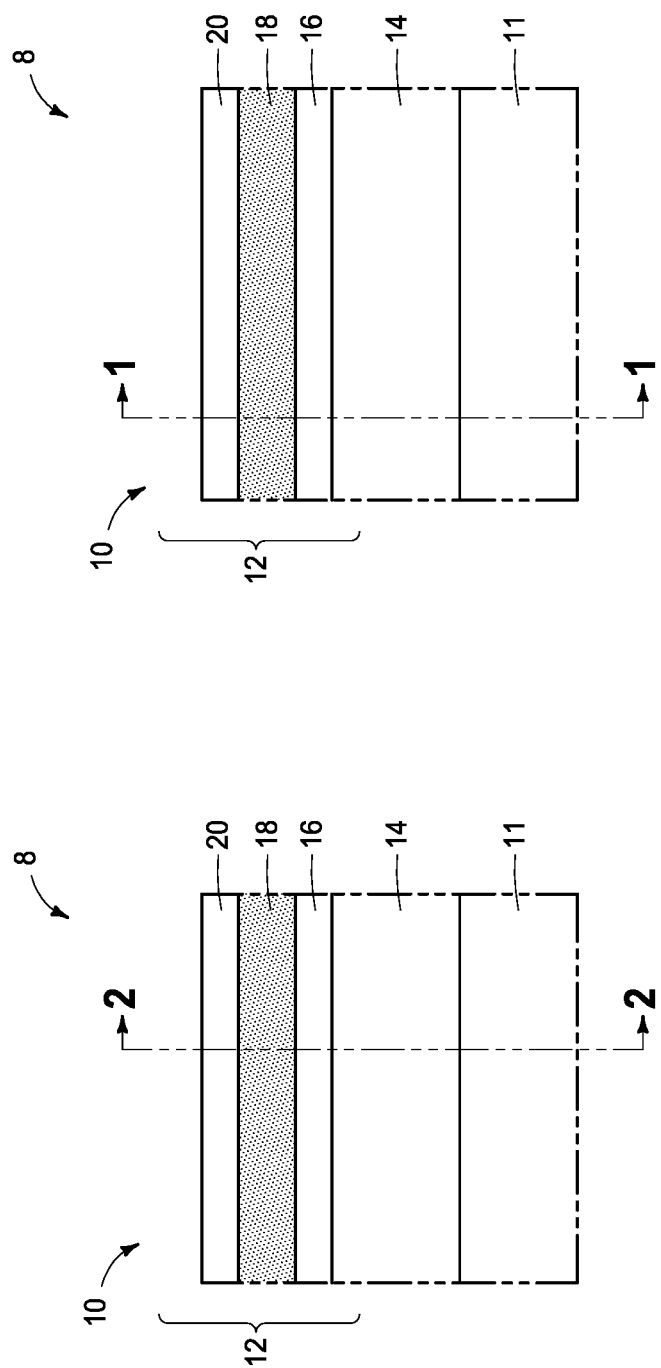

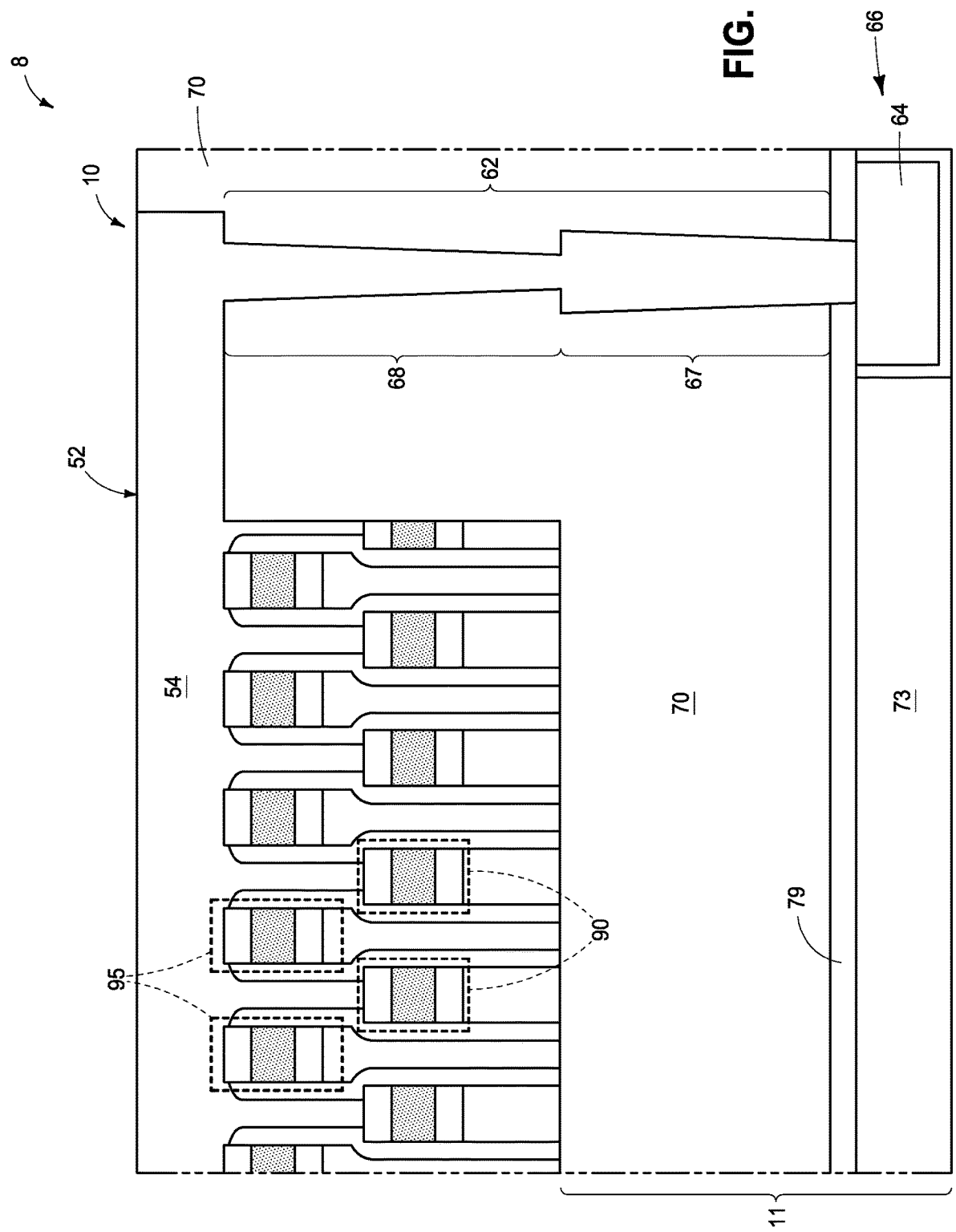

US 11,302,748 B2

ARRAYS OF MEMORY CELLS AND METHODS OF FORMING AN ARRAY OF ELEVATIONALLY-OUTER-TIER MEMORY CELLS AND ELEVATIONALLY-INNER-TIER MEMORY CELLS

RELATED PATENT DATA

This patent resulted from a continuation application of U.S. patent application Ser. No. 15/497,503, filed Apr. 26, 2017, entitled "Arrays Of Memory Cells And Methods Of Forming An Array Of Elevationally-Outer-Tier Memory Cells And Elevationally-Inner-Tier Memory Cells", naming Anna Maria Conti, Agostino Pirovano, and Andrea Redaelli as inventors, the disclosure of which is incorporated by reference.

TECHNICAL FIELD

Embodiments disclosed herein pertain to arrays of memory cells and to methods of forming an array of memory cells.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or nonvolatile. Nonvolatile memory cells can store data for extended periods of time in the absence of power. Nonvolatile memory is conventionally specified to be memory having a retention time of at least about 10 years. Volatile memory dissipates, and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

The smallest and simplest memory cell will likely be comprised of two electrodes having a programmable material, and possibly a select device (such as a diode or ovonic threshold switch), received between them. Suitable programmable materials have two or more selectable memory states to enable storing of information by an individual memory cell. The reading of the cell determines which of the states the programmable material is in, and the writing of information to the cell places the programmable material in a predetermined state. Some programmable materials retain a memory state in the absence of refresh, and thus may be incorporated into nonvolatile memory cells.

Arrays of memory cells may comprise a plurality of access lines at one elevation and a plurality of sense lines at another elevation, with at least programmable material there-between. Individual memory cells are written to or read from by application of suitable voltage and/or current to the respective crossing access line and sense line. Some arrays of memory cells include two or more elevationally stacked tiers or decks of memory cells, with each tier comprising a plurality of access lines at one elevation, a plurality of sense lines at another elevation, and at least programmable material there-between. The tiers or decks are typically fabricated separately and sequentially, one atop another.

BRIEF DESCRIPTION OF THE DRAWINGS

FIG. 1 is a diagrammatic sectional view of a substrate in process in accordance with an embodiment of the invention, and is taken through line 1-1 in FIG. 2.

FIG. 2 is a diagrammatic sectional view taken through line 2-2 in FIG. 1.

FIG. 25 is an expanded diagrammatic sectional view of the FIG. 19 substrate.

DETAILED DESCRIPTION OF EXAMPLE EMBODIMENTS

Figure 5:
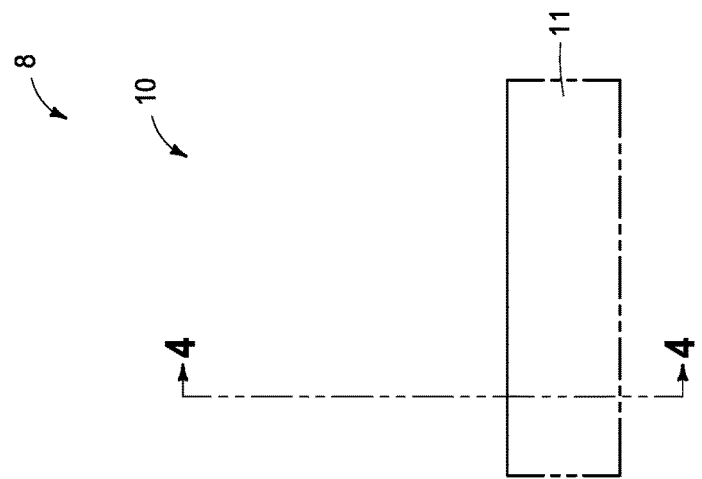
FIG. 5 is a sectional view taken through line 5-5 in FIGS. 3 and 4.

Embodiments of the invention encompass methods of forming an array of elevationally-outer-tier memory cells and elevationally-inner-tier memory cells, and arrays of memory cells independent of method of manufacture. Referring to FIGS. 1 and 2, an example fragment of a substrate construction 8 comprises an array or array area 10 that will comprise individual memory cells fabricated relative to a base substrate 11. Substrate 11 may comprise any one or more of conductive/conductor/conducting (i.e., electrically herein), semiconductive/semiconductor/semiconducting, and insulative/insulator/insulating (i.e., electrically herein) materials. Materials may be aside, elevationally inward, or elevationally outward of the FIGS. 1 and 2-depicted materials. For example, other partially or wholly fabricated components of integrated circuitry may be provided somewhere above, about, or within substrate fragment 11. Control and/or other peripheral circuitry for operating components within the memory array may also be fabricated, and may or may not be wholly or partially within a memory array or sub-array. Further, multiple sub-arrays may also be fabricated and operated independently, in tandem, or otherwise relative one another. As used in this document, a "sub-array" may also be considered as an array.

Array 10 will comprise multiple (i.e., at least two) tiers or levels of memory cells. The discussion proceeds with reference to fabrication of an array of memory cells in two tiers, although more than two tiers may be fabricated. Regardless, such an array will comprise an elevationally-inner-tier of memory cells and an elevationally-outer-tier of memory cells, and which in one embodiment are immediately-proximate one another (i.e., there being no other tier of memory cells between the elevationally-inner and outer tiers in such one embodiment). FIGS. 1 and 2 show an elevationally-inner-tier 12 of materials in fabrication for an elevationally-inner-tier of memory cells. Such includes, in one embodiment, conductive materials 14, 16, and 20 and inner-tier-programmable material 18 between conductive materials 16 and 20. Any suitable conductive material(s) may be used for materials 14, 16, and 20, for example metal material and/or conductively-doped semiconductive material, with elemental tungsten being one specific example for material 14 and carbon and/or a carbon-nitride being examples for each of materials 16 and 20. Such carbon/carbon-nitride might be provided where an otherwise adverse interaction may occur between inner-tier-programmable material 18 and metal material if such were directly against one another. Alternately, inner-tier-programmable material 18 may be directly against conductive material 14. Any suitable existing or yet-to-be-developed programmable material(s) may be used for material 18 (e.g., resistance-variable, ferroelectric, chalcogenide, phase change, memristive, etc.). The discussion proceeds with fabrication of individual memory cells that are devoid of a select device (e.g., a self-selected memory cell, for example as described in U.S. Pat. No. 8,847,186). Alternately, individual memory cells may be provided with a select device (not shown), for example with such a device being between inner-tier-programmable material 18 and conductive material 14 or above inner-tier-programmable material 18 and below elevationally-outer-conductive-line material there-above (not shown). If a select device is used, such may comprise any existing or yet-to-be-developed select devices, for example a junction device, a diode, an ovonic-threshold switch, chalcogenide material(s), etc. Example diodes include PN diodes, PIN diodes, Schottky diodes, Zener diodes, avalanche diodes, tunnel diodes, diodes having more than three materials, etc. Example thicknesses for materials 14 and 18 are 30 nanometers (nm) to 60 nm and 20 nm to 30 nm, respectively. Example thickness for each of materials and 16 and 20 is 10 nm to 15 nm.

Figure 4:
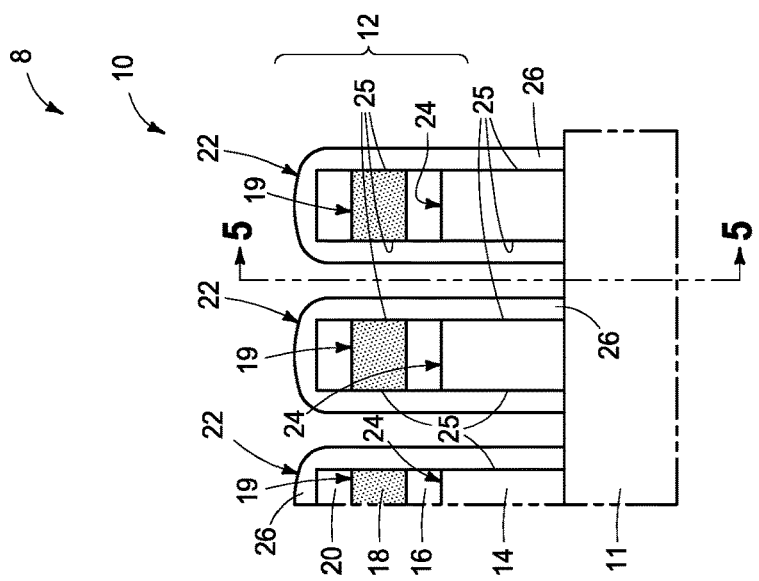
FIG. 4 is a sectional view taken through line 4-4 in FIGS. 3 and 5.
Figure 3:
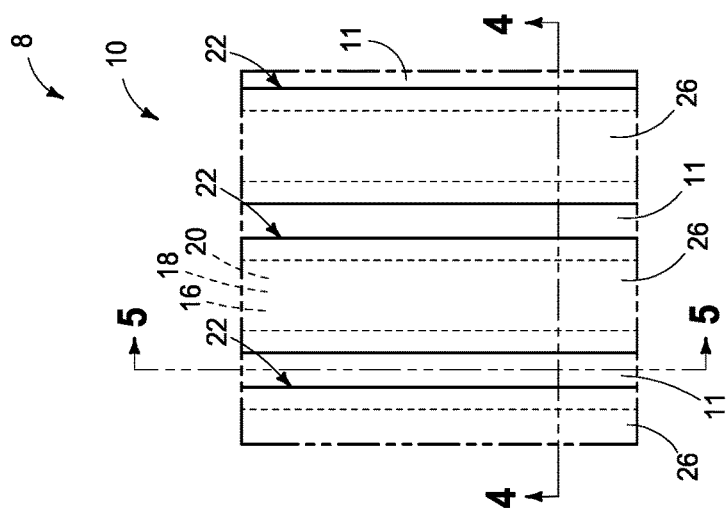
FIG. 3 is a top view of the FIG. 1 substrate at a processing step subsequent to that shown by FIG. 1.

Referring to FIGS. 3-5, an elevationally-inner-tier of line constructions 22 has been formed and comprises inner-tier-spaced-lower-first-conductive lines 24 of conductive material 14 and inner-tier-programmable material 18 directly above lines 24. In one embodiment and as shown, inner-tier-programmable material 18 has been formed to comprise spaced-programmable-material lines 19. Regardless, inner-tier-programmable material 18 and inner-tier-lower-first-conductive lines 24 have sidewalls 25. Insulator material 26 (e.g., silicon dioxide and/or silicon nitride) is over sidewalls 25 of inner-tier-lower-first-conductive lines 24 and over sidewalls 25 of inner-tier-programmable material 18, and comprises a portion of individual inner-tier-line constructions 22. Such line constructions may be formed by any suitable technique, for example subtractive photolithographic patterning and etch of materials 14, 16, 18, and 20 with or without using pitch multiplication. Then, insulator material 26 may be formed over such previously-patterned lines, followed by an etch thereof which leaves insulator material atop conductive material 20 (when present) and atop materials 18, 16, and 14. Such etching may remove insulator material 26 from being over laterally-central-horizontal surfaces between immediately-adjacent line constructions 22 as shown. Alternately, and by way of example only, insulator material 26 might not be subjected to such an anisotropic etch or to some anisotropic etch which leaves (not shown) at least some insulator material 26 centrally between immediately-adjacent line constructions 22. Regardless, in one embodiment, lateral spacing between conductive material 14 of immediately-laterally-adjacent inner-tier line constructions 22 may be at a minimum lithographically-formed (e.g., using photolithography) feature size, and lateral thickness of insulator material 26 on each side of individual inner-tier-line constructions 22 may be less than such minimum feature size.

Figure 8:
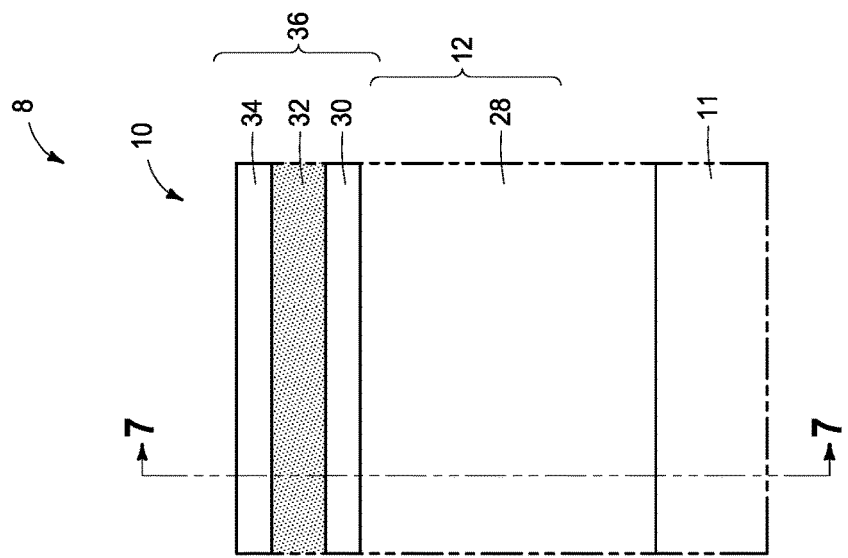
FIG. 8 is a sectional view taken through line 8-8 in FIGS. 6 and 7.
Figure 7:
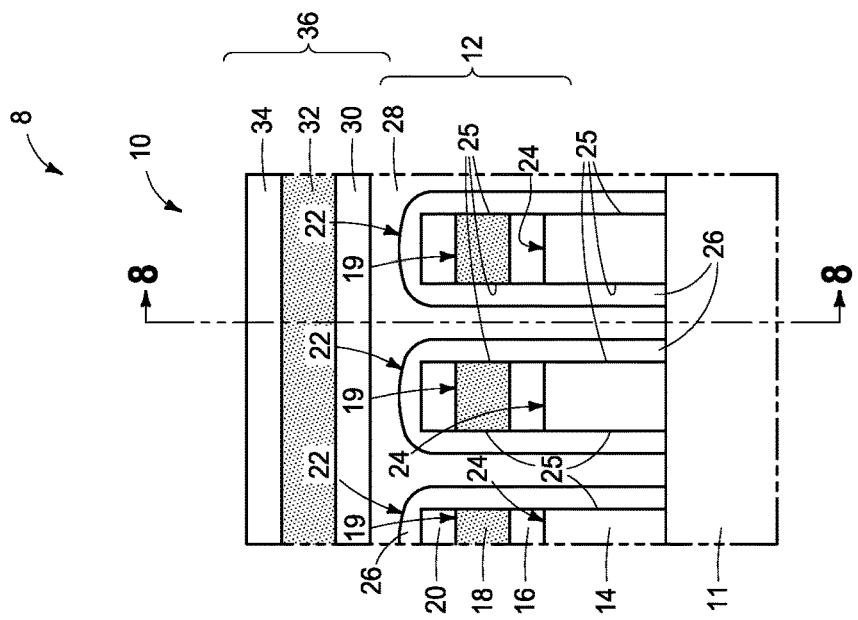
FIG. 7 is a sectional view taken through line 7-7 in FIGS. 6 and 8.
Figure 6:
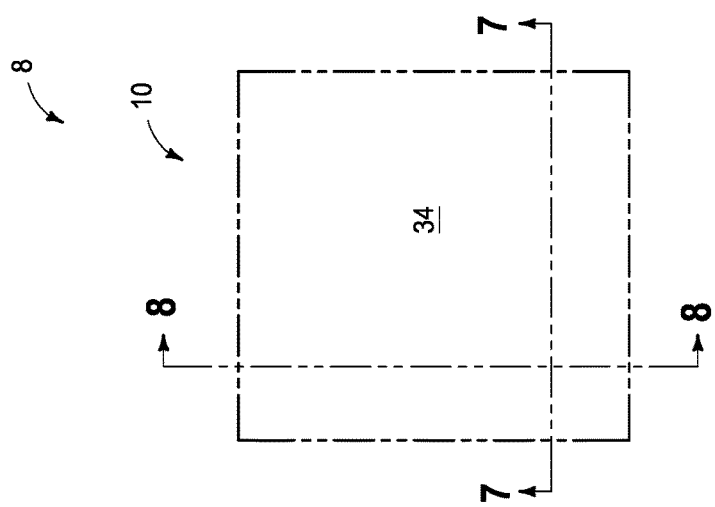
FIG. 6 is a view of the FIG. 3 substrate at a processing step subsequent to that shown by FIG. 3.

Referring to FIGS. 6-8, conductive material 28 has been formed, and in one embodiment as shown, to completely fill and over-fill space between immediately-adjacent line constructions 22. Alternately, an elevationally-outermost surface of conductive material 28 and conductive material 30 may be laterally-between immediately-adjacent line constructions 22 anywhere (not shown in FIGS. 6-8) from a top of material 26 to below a bottom of conductive material 14. Any suitable conductive material may be used, with elemental tungsten being but one specific example. Materials 30 and 34 and outer-tier-programmable material 32 have been formed directly above conductive material 28. Example materials 30, 32, and 34 may have one or more of the same attributes as described above with respect to example materials 16, 18, and 20, respectively, and need not be of the same compositions and/or thicknesses as the examples described for such above. Select device material (not shown) may be below or above outer-tier-programmable material 32. Regardless, FIGS. 6-8 show an elevationally-outer tier 36 of materials in fabrication for an elevationally-outer-tier of memory cells.

Figure 11:
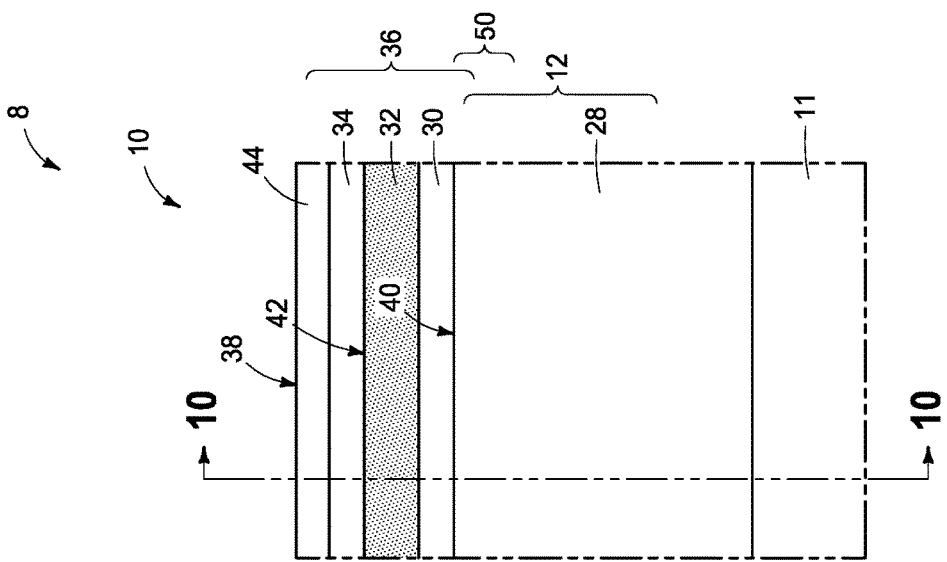
FIG. 11 is a sectional view taken through line 11-11 in FIGS. 9 and 10.
Figure 10:
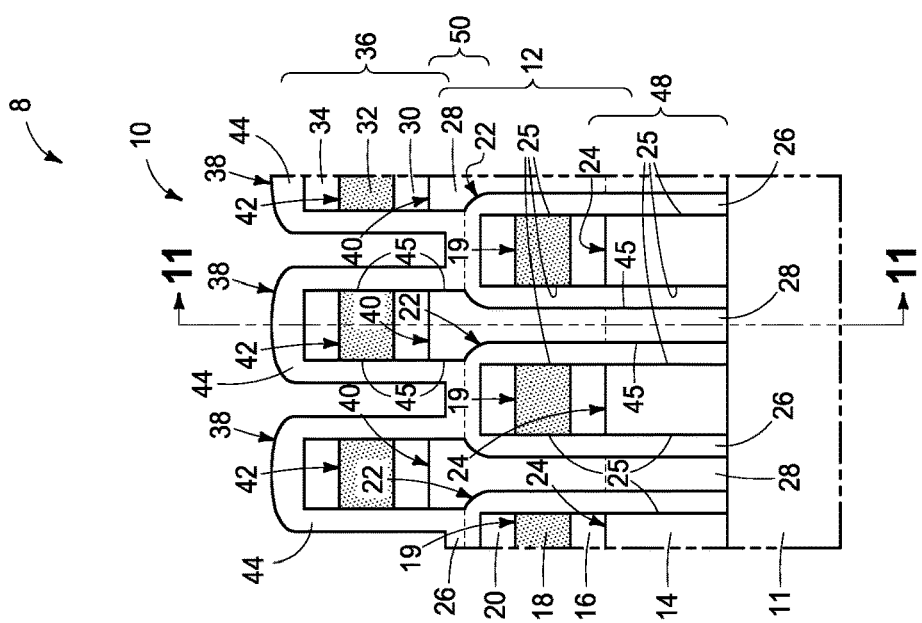
FIG. 10 is a sectional view taken through line 10-10 in FIGS. 9 and 11.
Figure 9:
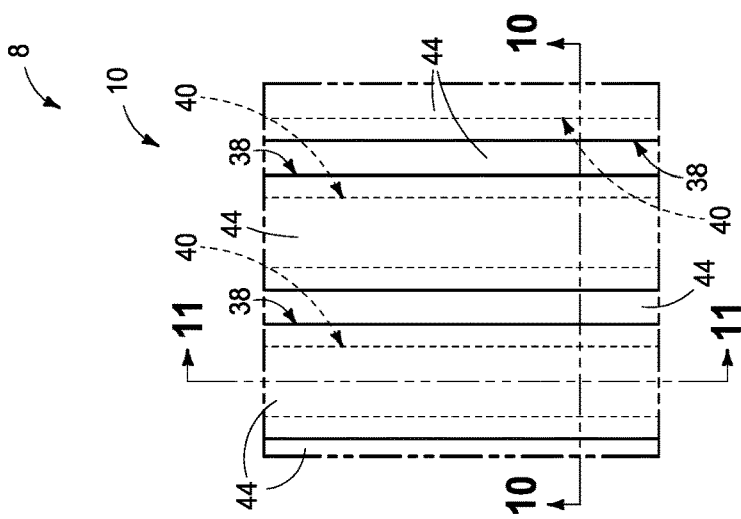
FIG. 9 is a view of the FIG. 6 substrate at a processing step subsequent to that shown by FIG. 6.

Referring to FIGS. 9-11, an elevationally-outer tier of line constructions 38 has been formed which comprises spaced-lower-first-conductive lines 40 and programmable material 32 directly above outer-tier-lower-first-conductive lines 40. In one embodiment and as shown, outer-tier-programmable material 32 is formed to comprise spaced-programmable-material lines 42. Regardless, outer-tier-lower-first-conductive lines 40 have sidewalls 45 and outer-tier-programmable material 32 has sidewalls 45. Insulative material 44 has been formed over sidewalls 45 of outer-tier-lower-first-conductive lines 40 and over sidewalls of outer-tier-programmable material 32. Such may be of the same or different composition as that of insulative material 26, again with silicon dioxide and/or silicon nitride being examples. In one embodiment and as shown, insulative material 26 also constitutes insulative material which is over sidewalls 45 of outer-tier-lower-first-conductive lines 40. If, for example, elevationally-outermost surfaces of outer-tier-lower-first-conductive lines 40 are below (not shown) elevationally-outermost surfaces of material 20, no insulative material 44 may be over sidewalls 45 of outer-tier-lower-first-conductive lines 40. Regardless, individual outer-tier-lower-first-conductive lines 40 are laterally between and longitudinally-elongated parallel with immediately-adjacent inner-tier-line constructions 22.

The above processing describes but one technique of forming outer-tier-line constructions 38, although any existing or yet-to-be-developed alternate or additional methods may be used. For example, and with respect to the above-described embodiment, and in but one example, such shows forming at least lowermost portions 48 of outer-tier-lower-first-conductive lines 40 in a self-aligned manner by depositing conductive material 28 laterally between and longitudinally-elongated parallel with immediately-adjacent inner-tier-line constructions 22. Outer-tier-programmable material 32 has been formed directly above conductive material 28. In one embodiment and as shown, at least outer-tier-programmable material 32 (and conductive material 30 when present) is patterned to form lines 42 thereof that are directly above lowermost portions 48 of outer-tier-lower-first-conductive lines 40. In one embodiment and as shown, uppermost portions 50 of outer-tier-lower-first-conductive lines 40 have been formed in a non-self-aligned manner, for example by patterning an uppermost portion of deposited conductive material 28 that is higher than inner-tier line constructions 22 using a mask. For example, a mask (not shown) comprising masking material (not shown) of the same general longitudinal outline of the tops of lines 40, 42 could be provided above material 34, with such mask then being used to pattern the example depicted line constructions of materials 28, 30, 32, and 34, followed by removal of such mask/masking material. Alternately and by way of example only, an uppermost surface of material 28 may be laterally between (not shown in FIGS. 9-11) line constructions 22 whereby all of outer-tier-lower-first-conductive lines 40 may be formed in a self-aligned manner.

Figure 14:
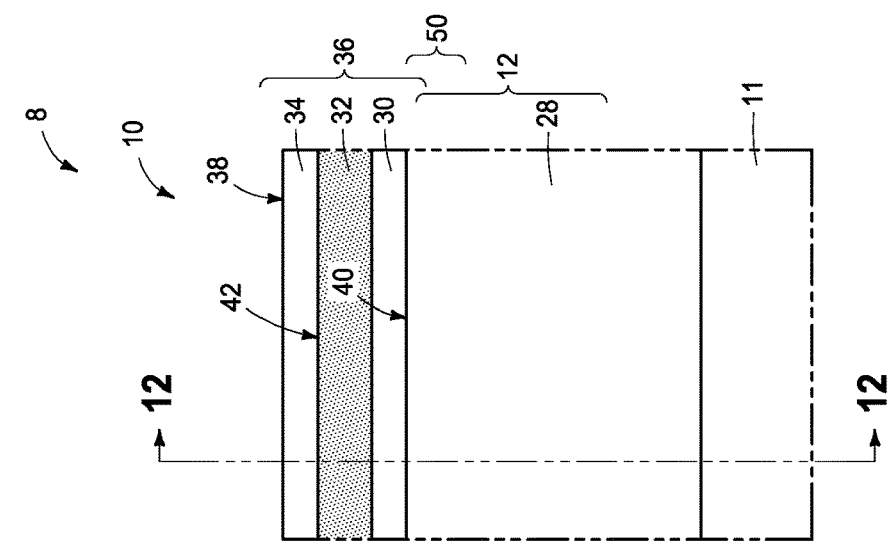
FIG. 14 is a sectional view taken through line 14-14 in FIGS. 12 and 13.
Figure 13:
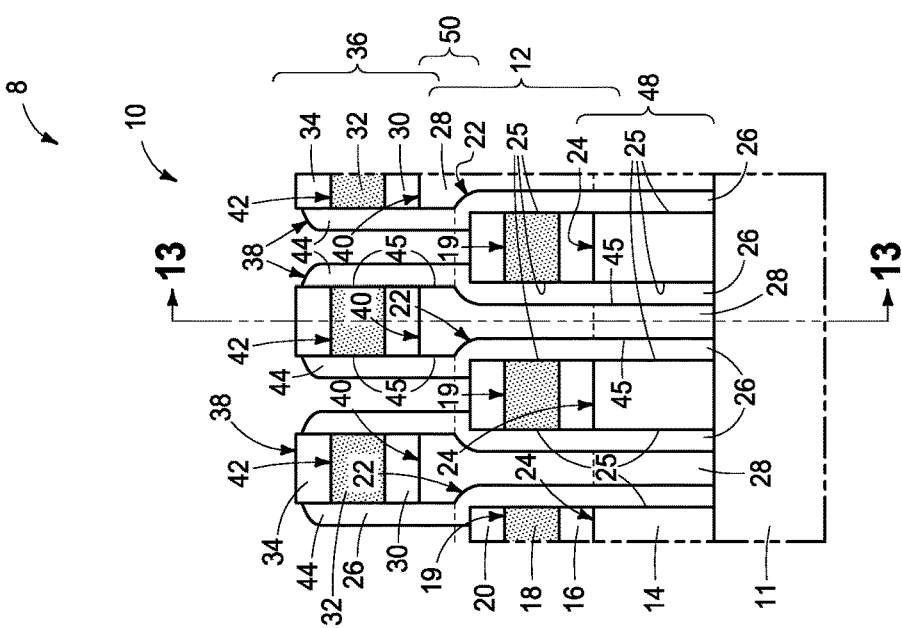
FIG. 13 is a sectional view taken through line 13-13 in FIGS. 12 and 14.
Figure 12:
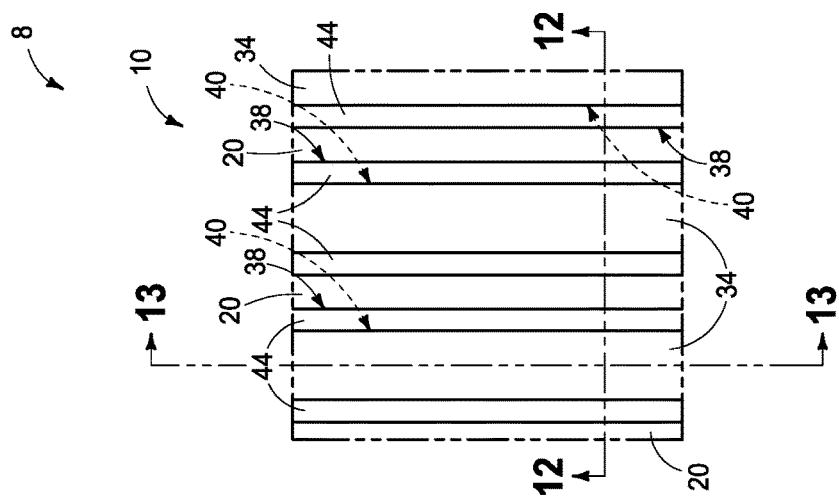
FIG. 12 is a view of the FIG. 9 substrate at a processing step subsequent to that shown by FIG. 9.

Regardless, and in one embodiment, FIGS. 12-14 show example subsequent processing whereby insulative material 44 that is over sidewalls 45 and tops of outer-tier-programmable-material lines 42 (and material 34 when present) has been anisotropically etched to remove it from being over the tops of line constructions 38 and also to remove insulative material 44 and 26 from being over central portions of tops of line constructions 22.

Figure 17:
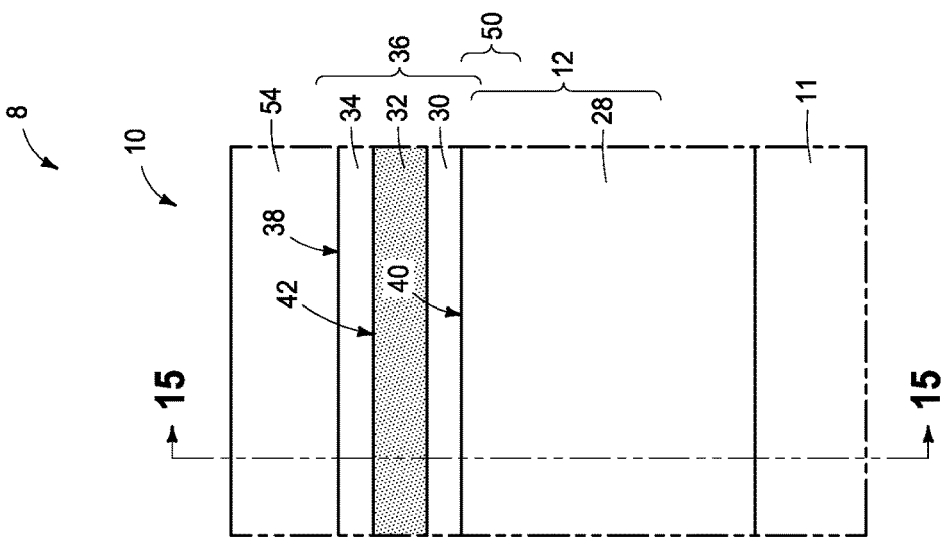
FIG. 17 is a sectional view taken through line 17-17 in FIGS. 15 and 16.
Figure 16:
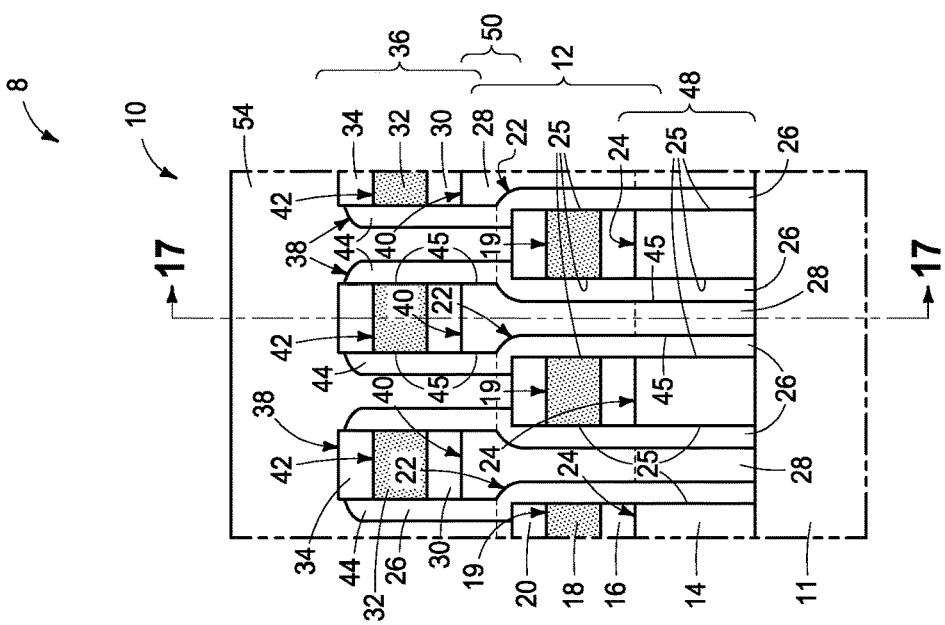
FIG. 16 is a sectional view taken through line 16-16 in FIGS. 15 and 17.
Figure 15:
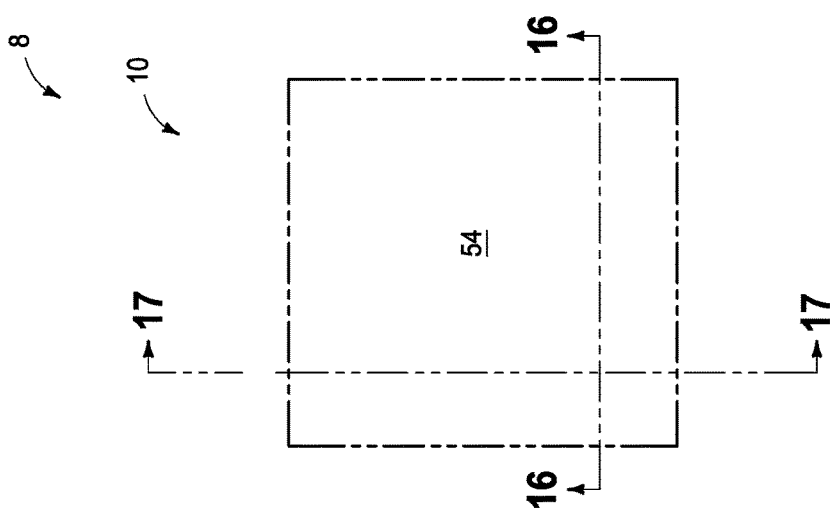
FIG. 15 is a view of the FIG. 12 substrate at a processing step subsequent to that shown by FIG. 12.

Spaced-upper-second-conductive lines are formed for each of an elevationally-outer tier of memory cells and an elevationally-inner tier of memory cells. In one such embodiment, the upper-second-conductive lines are formed to be a single set of such lines that are electrically shared by the outer-tier memory cells and the inner-tier memory cells. For example, and referring to FIGS. 15-17, conductor material 54 has been formed above and laterally-between immediately-adjacent outer-tier-line constructions 38 with, in one embodiment, conductor material 54 being electrically coupled to each of inner-tier-programmable material 18 (e.g., through conductive material 20) and outer-tier-programmable-material 32 (e.g., through conductive material 34).

Figure 20:
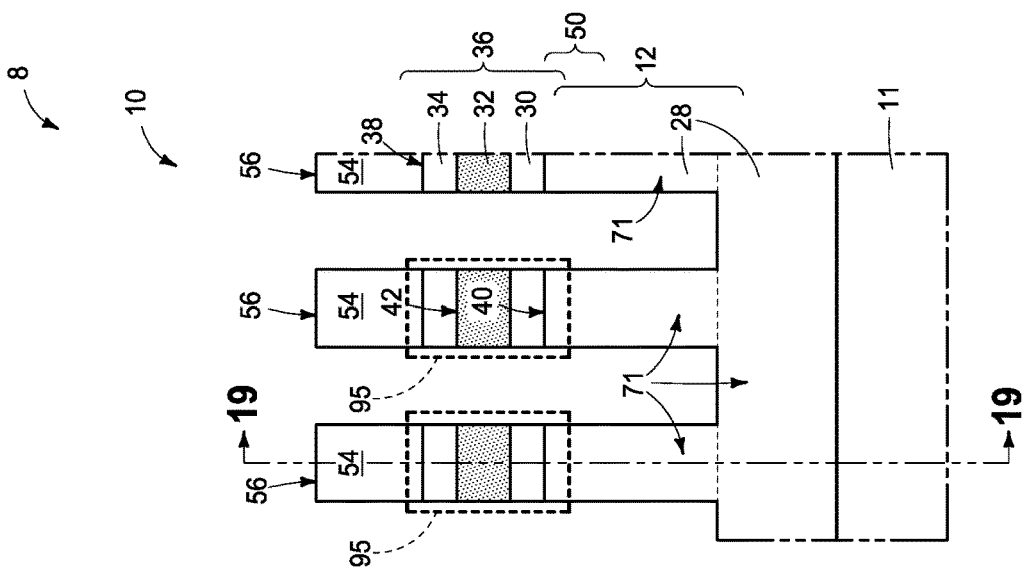
FIG. 20 is a sectional view taken through line 20-20 in FIGS. 18 and 19.
Figure 19:
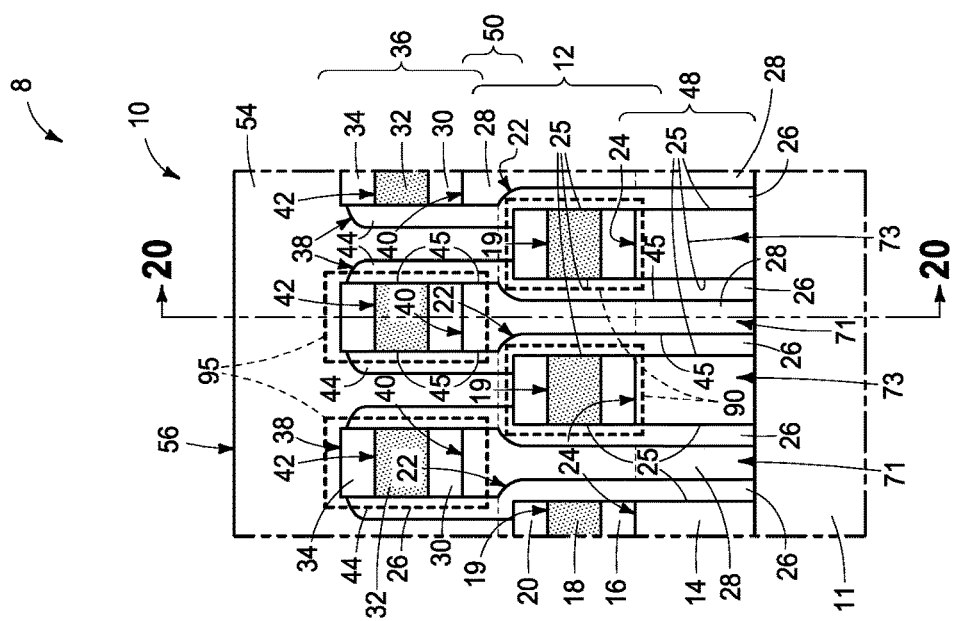
FIG. 19 is a sectional view taken through line 19-19 in FIGS. 18 and 20.
Figure 18:
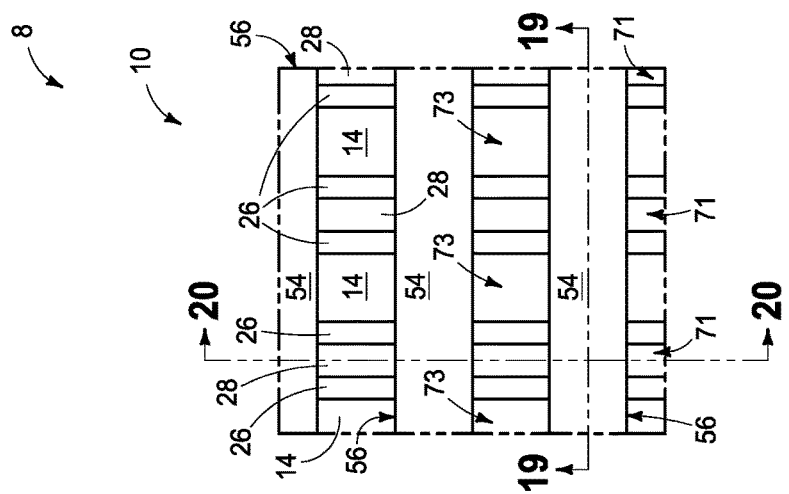
FIG. 18 is a view of the FIG. 15 substrate at a processing step subsequent to that shown by FIG. 15.

Referring to FIGS. 18-20, conductor material 54 has been patterned to form spaced-upper-second-conductive lines 56 for, in one embodiment, each of an elevationally-out tier 36 of memory cells 95 and an elevationally-inner tier 12 of memory cells 90 that are a single set of such lines that are electrically shared by elevationally-outer-tier memory cells 95 and elevationally-inner-tier memory cells 90. In one such embodiment and as shown, such patterning comprises etching through outer-tier-programmable-material lines 42 and into inner-tier-line constructions 22 using at least spaced-upper-second-conductive lines 56 as a mask. Additional masking material (not shown) may be directly above upper-second-conductive lines 56 with, regardless, at least spaced-upper-second-conductive lines 56 there-beneath being part of the mask which is used with respect to such etching in such embodiment. Regardless, pitch multiplication may be used. The above example embodiments depict etching completely through materials 20, 18, and 16 of inner-tier memory cells 90, although in the patterning etching may only (not shown) be conducted through material 20 and not at all or only partially into lower-tier-programmable material 18.

Lines 24, 40, and 56 are shown as being straight-linear, with lines 56 crossing orthogonally relative to lines 24 and 40, although any other crossing relationship(s) or construction(s) may be used. Regardless, any of conductive lines 24, 40, and 56 may connect to other circuitry within and/or peripheral to array 10 and may, for example, do so on different sides of the array for alternating (e.g., even/odd) of such lines. Further and regardless, arrangement of lines 40 and 24 as shown my facilitate heat dissipation in a direction perpendicular to the depicted longitudinal orientation of line constructions 38 and 22 and may thereby reduce thermal disturb.

In one embodiment, a method of forming an array of memory cells comprises depositing conductor material (e.g., 54) for all of the spaced-upper-second-conductive lines (e.g., 56) and patterning all of such conductor material for all shared spaced-upper-second-conductive lines using only a single masking step, for example as shown and described above. In one such embodiment, the upper-second-conductive lines are formed directly above outer-tier-programmable material (e.g., 32). In one embodiment, the upper-second-conductive lines are formed directly above inner-tier-programmable material (e.g., 18). In one such embodiment, such patterning with the single mask is conducted after forming inner-tier-lower-first-conductive lines (e.g., 24) and after forming outer-tier-lower-first-conductive lines (e.g., 40). In one such embodiment, such patterning is conducted with the single mask after forming the inner-tier-programmable material and after forming the outer-tier-programmable material. In one embodiment, the spaced-upper-second-conductive lines are directly above both of the inner-tier-programmable material and the outer-tier-programmable material. Regardless, any other attribute(s) or aspect(s) as shown and/or described herein with respect to other embodiments may be used.

Figure 21:
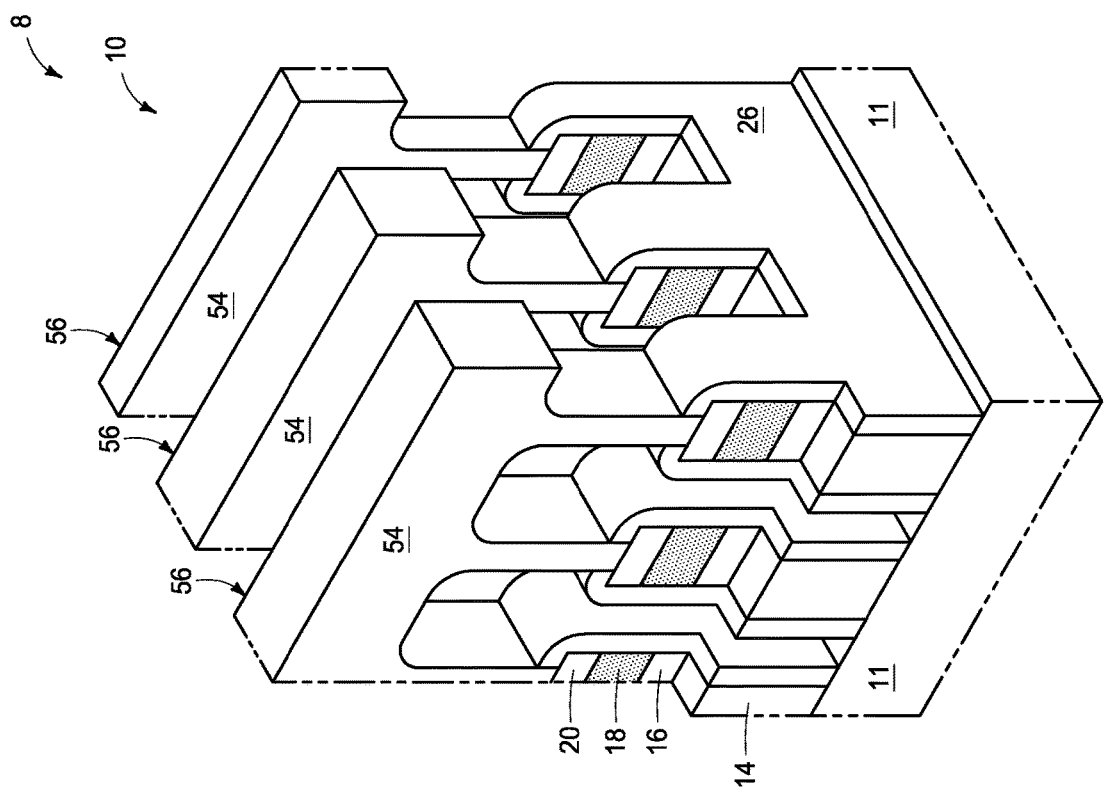
FIG. 21 is a diagrammatic perspective view of the substrate of FIGS. 18-20.
Figure 22:
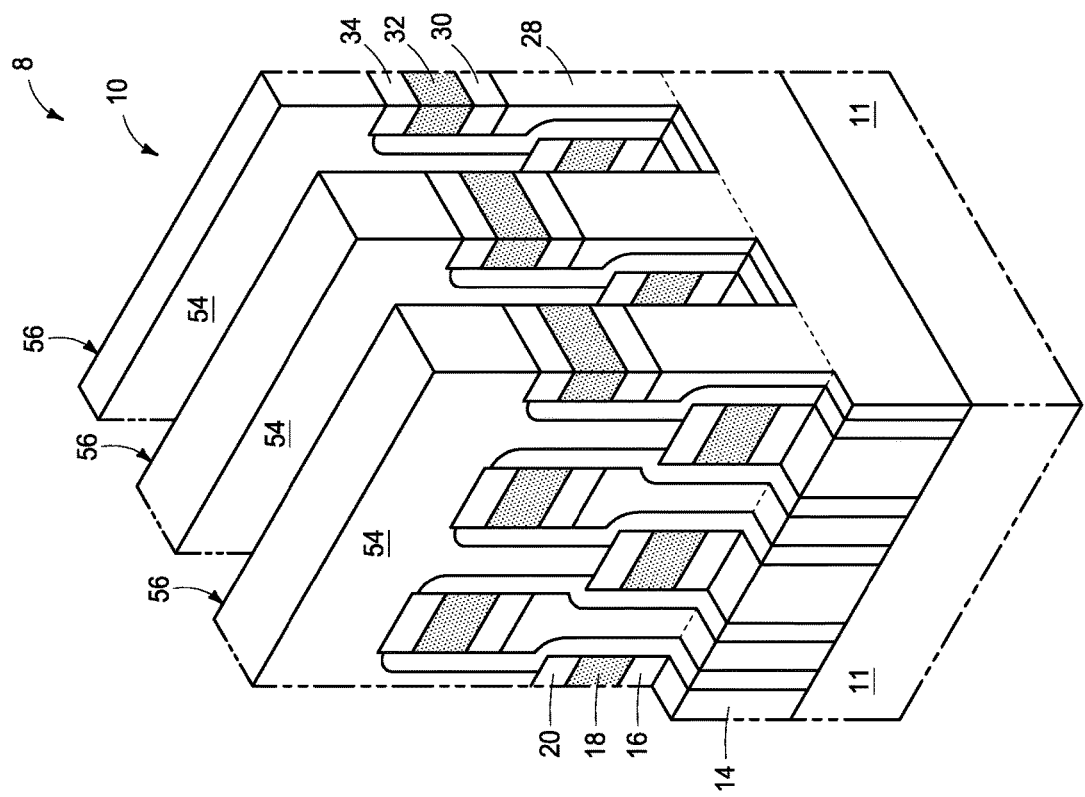
FIG. 22 is a diagrammatic perspective view of the substrate of FIG. 21 wherein some materials have been removed for clarity of remaining components.
Figure 23:
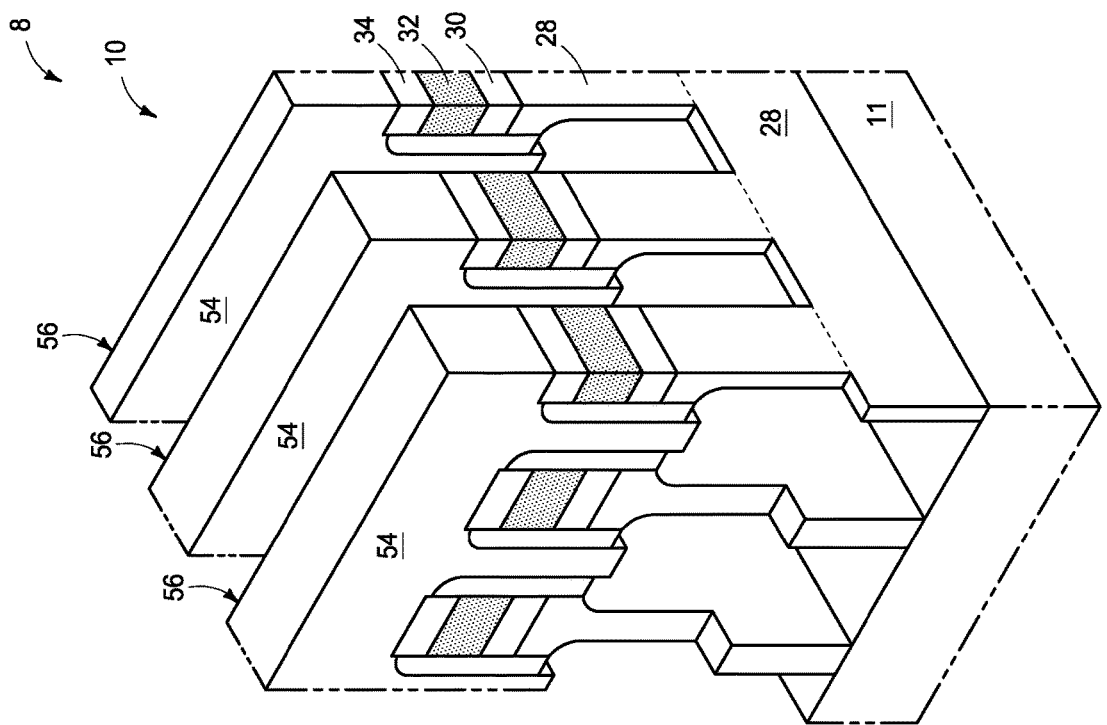
FIG. 23 is a diagrammatic perspective view of the substrate of FIG. 21 wherein some materials have been removed for clarity of remaining components.

FIGS. 21-23 show example larger perspective-like views of array 10 wherein certain features are shown and certain features are not shown to assist the reader with respect to the example depicted embodiment.

The above-described method embodiment may enable reduction of a masking step over prior art methodology, whereby only a single masking step may now be used for patterning second conductive lines that are shared by immediately tier-adjacent memory cells. Heretofore, separate patterning steps (i.e., masking steps) have been used to pattern second conductive lines that are shared by upper and immediately-lower-tier arrays of memory cells. Only a single such masking step may be used in some embodiments of the invention. Additionally, it previously has typically also included three separate masking steps for forming a conductive interconnect from upper-tier-uppermost conductive lines to peripheral circuitry (e.g., in periphery-under-array architectures). FIG. 25 shows an example larger and expanded sectional view of the construction of FIG. 19 showing a conductive interconnect 62 connecting with a node 64 of underlying circuitry 66. Substrate 11 comprises example dielectric materials 70 and 79, and an underlying material 73 (e.g., dielectric and/or semiconductive). In the FIG. 25 example, and in but one embodiment, only two masking steps may be used for forming conductive interconnect 62, namely one masking step for forming a lower portion 67 thereof, and another masking step for forming an upper portion 68 thereof. More masking steps may be saved, combined, and/or eliminated if fabricating more than two tiers.

Embodiments of the invention also encompass an array of memory cells independent of method of manufacture. However, such an array may have any of the structural attributes described above with respect to method embodiments and vice versa.

In one embodiment, an array (e.g., 10) includes an elevationally-inner tier (e.g., 12) of memory cells (e.g., 90) comprising spaced-inner-tier-lower-first-conductive lines (e.g., 24) and inner-tier-programmable material (e.g., 18) directly above the such lines. The array includes an elevationally-outer tier (e.g., 36) of memory cells (e.g., 95) comprising spaced-outer-tier-lower-first-conductive lines (e.g., 40) and outer-tier-programmable material (e.g., 32) directly above such lines. In one embodiment, the outer-tier-lower-first-conductive lines respectively have a lowermost portion (e.g., 48) that is laterally between, spaced from, and longitudinally-elongated parallel with immediately-adjacent of the spaced-inner-tier-lower-first-conductive lines. In one such embodiment, the outer-tier-lower-first-conductive lines respectively have an uppermost portion (e.g., 50) that is higher than the inner-tier-programmable material. In one embodiment, such lowermost portion is below inner-tier-programmable material 18. In one embodiment, the outer-tier-lower-first-conductive lines have respective laterally-narrowest portions (e.g., 71 in FIGS. 18-20) that are narrower than respective laterally-narrowest portions (e.g., 73 in FIGS. 18-20) of the inner-tier-lower-first-conductive lines.

The array comprises spaced-upper-second-conductive lines for each of the outer-tier memory cells and the inner-tier memory cells (i.e., regardless of whether those lines are shared by the outer-tier memory cells and the inner-tier memory cells). In one embodiment, the spaced-upper-second-conductive lines (e.g., 56) are electrically shared by the outer-tier memory cells and the inner-tier memory cells. In one embodiment, the spaced-upper-second-conductive lines are directly above the outer-tier-programmable material. In one embodiment, the upper-second-conductive lines are directly above the inner-tier-programmable material.

Figure 24:
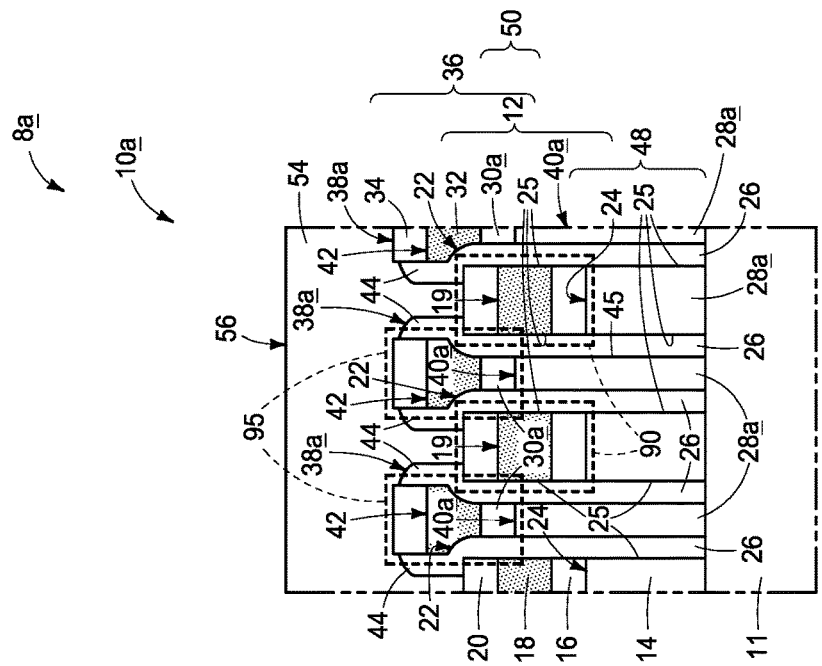
FIG. 24 is a view of an alternate-embodiment substrate to that shown by FIG. 19.

An alternate embodiment substrate construction 8a comprising an array 10a is shown in FIG. 24. Like numerals from the above-described embodiments have been used where appropriate, with some construction differences being indicated with the suffix "a". Outer-tier-line constructions 38a are shown wherein an uppermost surface of material 28a and an uppermost surface of material 30a are laterally between line constructions 22. In one method embodiment, all of outer-tier-lower-first-conductive lines 40a may be formed in a self-aligned manner. Any other attribute(s) or aspect(s) as shown and/or described herein with respect to other embodiments may be used.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction along a primary substrate surface and may be relative to which the substrate is processed during fabrication, and vertical is a direction generally orthogonal thereto. Further, "vertical" and "horizontal" as used herein are generally perpendicular directions relative one another and independent of orientation of the substrate in three-dimensional space. Additionally, "elevationally-extending" and "extending elevationally" refer to a direction that is angled away by at least 45° from horizontal.

Further, "directly above" requires at least some lateral overlap (i.e., horizontally) of two stated regions/materials/components relative one another. Use of "above" not preceded by "directly" only requires that some portion of the stated region/material/component that is above the other be elevationally outward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

Also, reference to "first" and "second" with respect to different components or materials herein is only for convenience of description in referring to different components, different materials, and/or same materials or components formed at different times. Accordingly, and unless otherwise indicated, "first" and "second" may be interchanged independent of relative position within the finished circuit construction and independent of sequence in fabrication.

Further, a "self-aligned manner" means a technique whereby at least a lateral surface of a structure is defined by deposition of material against a sidewall of a previously-patterned structure, and in some embodiments is with respect to an opposing pair of lateral surfaces or edges, thereby not requiring subsequent photolithographic or other mask-based processing with respect to such lateral surface(s) or edge(s).

CONCLUSION

In some embodiments, a method of forming an array of elevationally-outer-tier memory cells and elevationally-inner-tier memory cells comprises forming an elevationally-inner tier of line constructions comprising spaced-lower-first-conductive lines, programmable material directly above the inner-tier-lower-first-conductive lines, and insulator material over sidewalls of the inner-tier-lower-first-conductive lines and over sidewalls of the inner-tier-programmable material. An elevationally-outer tier of line constructions is formed and comprises spaced-lower-first-conductive lines, spaced-programmable-material lines directly above the outer-tier-lower-first-conductive lines, and insulative material over sidewalls of the outer-tier-lower-first-conductive lines and over sidewalls of the outer-tier-programmable-material lines. Individual of the outer-tier-lower-first-conductive lines are laterally between and longitudinally-elongated parallel with immediately-adjacent of the inner-tier-line constructions. The forming of the outer-tier-line constructions comprises forming at least lowermost portions of the outer-tier-lower-first-conductive lines in a self-aligned manner by depositing conductive material laterally between and longitudinally-elongated parallel with immediately-adjacent of the inner-tier-line constructions. The outer-tier-programmable material is formed directly above the conductive material. At least the outer-tier-programmable material is patterned to form lines thereof that are directly above the lowermost portions of the outer-tier-lower-first-conductive lines. The insulative material is formed over tops and the sidewalls of the outer-tier-programmable material lines and then the insulative material is anisotropically etched to remove it from being over the tops. Spaced-upper-second-conductive lines are formed for each of an elevationally-outer tier of memory cells and an elevationally-inner tier of memory cells.

In some embodiments, a method of forming an array of elevationally-outer-tier memory cells and elevationally-inner-tier memory cells comprises forming an elevationally-inner tier of line constructions comprising spaced-lower-first-conductive lines, programmable material directly above the inner-tier-lower-first-conductive lines, and insulator material over sidewalls of the inner-tier-lower-first-conductive lines and over sidewalls of the inner-tier-programmable material. An elevationally-outer tier of line constructions is formed to comprise spaced-lower-first-conductive lines, programmable material directly above the outer-tier-lower-first-conductive lines, and insulative material over sidewalls of the outer-tier-lower-first-conductive lines and over sidewalls of the outer-tier-programmable material. Individual of the outer-tier-lower-first-conductive lines are laterally between and longitudinally-elongated parallel with immediately-adjacent of the inner-tier-line constructions. Conductor material is formed above and laterally between immediately-adjacent of the outer-tier-line constructions. The conductor material is electrically coupled to each of the inner-tier-programmable material and the outer-tier-programmable material. The conductor material is patterned to form spaced-upper-second-conductive lines for each of an elevationally-outer tier of memory cells and an elevationally-inner tier of memory cells and that comprise a single set of the upper-second-conductive lines that are electrically shared by the elevationally-outer-tier memory cells and the elevationally-inner-tier memory cells.

In some embodiments, a method of forming an array of memory cells, where the array comprises an elevationally-inner tier of memory cells comprising spaced-inner-tier-lower-first-conductive lines and inner-tier-programmable material directly there-above, an elevationally-outer tier of memory cells comprising spaced-outer-tier-lower-first-conductive lines and outer-tier-programmable material directly there-above, and spaced-upper-second-conductive lines that are electrically shared by the outer-tier memory cells and the inner-tier memory cells, comprises depositing conductor material for all of the shared-spaced-upper-second-conductive lines. All of the conductor material for all of the shared-spaced-upper-second-conductive lines is patterned using only a single masking step.

In some embodiments, an array of memory cells comprises an elevationally-inner tier of memory cells comprising spaced-inner-tier-lower-first-conductive lines and inner-tier-programmable material directly there-above. An elevationally-outer tier of memory cells is included and comprises spaced-outer-tier-lower-first-conductive lines and outer-tier-programmable material directly there-above. Spaced-upper-second-conductive lines are included and that are electrically shared by the outer-tier memory cells and the inner-tier memory cells. The spaced-upper-second-conductive lines are directly above the outer-tier-programmable material.

In some embodiments, an array of memory cells comprises an elevationally-inner tier of memory cells comprising spaced-inner-tier-lower-first-conductive lines and inner-tier-programmable material directly there-above. An elevationally-outer tier of memory cells is included and comprises spaced-outer-tier-lower-first-conductive lines and outer-tier-programmable material directly there-above. The outer-tier-lower-first conductive lines respectively have a lowermost portion that is laterally between, spaced from, and longitudinally-elongated parallel with immediately-adjacent of the inner-tier-lower-first-conductive lines. Spaced-upper-second-conductive lines are included for each of the outer tier of memory cells and the inner tier of memory cells.

In some embodiments, an array of memory cells comprises an elevationally-inner tier of memory cells comprising spaced-inner-tier-lower-first-conductive lines and inner-tier-programmable material directly there-above. An elevationally-outer tier of memory cells is included and comprises spaced-outer-tier-lower-first-conductive lines and outer-tier-programmable material directly there-above. The outer-tier-lower-first conductive lines respectively have a lowermost portion that is laterally between, spaced from, and longitudinally-elongated parallel with immediately-adjacent of the inner-tier-lower-first-conductive lines. Spaced-upper-second-conductive lines are included and are electrically shared by the outer-tier memory cells and the inner-tier memory cells. The spaced-upper-second-conductive lines are directly above both of the inner-tier-programmable material and the outer-tier-programmable material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming an array of memory cells, the array comprising an elevationally-inner tier of memory cells comprising spaced-inner-tier-lower-first-conductive lines and inner-tier-programmable material directly there-above, an elevationally-outer tier of memory cells comprising spaced-outer-tier-lower-first-conductive lines and outer-tier-programmable material directly there-above, and spaced-upper-second-conductive lines that are electrically shared by the outer-tier memory cells and the inner-tier memory cells, the method comprising:
   depositing conductor material for all of the shared-spaced-upper-second-conductive lines; and
   patterning all of the conductor material for all of the shared-spaced-upper-second-conductive lines using only a single masking step, the single masking step comprising forming lowermost portions of the outer-tier-lower-first-conductive lines in a self-aligned manner laterally between and laterally aside immediately-adjacent of the spaced-inner-tier-lower-first-conductive lines.

2. The method of claim 1 wherein some of the outer-tier-programmable material of individual of the outer tier memory cells is laterally aside and laterally spaced from the conductor material of the shared-spaced-upper-second-conductive lines.

3. A method of forming an array of memory cells, the array comprising an elevationally-inner tier of memory cells comprising spaced-inner-tier-lower-first-conductive lines and inner-tier-programmable material directly there-above, an elevationally-outer tier of memory cells comprising spaced-outer-tier-lower-first-conductive lines and outer-tier-programmable material directly there-above, and spaced-upper-second-conductive lines that are electrically shared by the outer-tier memory cells and the inner-tier memory cells, the method comprising:
   depositing conductor material for all of the shared-spaced-upper-second-conductive lines; and
   patterning all of the conductor material for all of the shared-spaced-upper-second-conductive lines using only a single masking step, the single masking step comprising forming the shared-spaced-upper-second-conductive lines to comprise an upper longitudinally continuous portion, the single masking step comprising forming the shared-spaced-upper-second-conductive lines to comprise a lowest portion that is longitudinally discontinuous, the outer-tier-programmable material being above the inner-tier-programmable material.

4. A method of forming an array of memory cells, the array comprising an elevationally-inner tier of memory cells comprising spaced-inner-tier-lower-first-conductive lines and inner-tier-programmable material directly there-above, an elevationally-outer tier of memory cells comprising spaced-outer-tier-lower-first-conductive lines and outer-tier-programmable material directly there-above, and spaced-upper-second-conductive lines that are electrically shared by the outer-tier memory cells and the inner-tier memory cells, the method comprising:
   depositing conductor material for all of the shared-spaced-upper-second-conductive lines; and
   patterning all of the conductor material for all of the shared-spaced-upper-second-conductive lines using only a single masking step, the single masking step comprising forming the shared-spaced-upper-second-conductive lines to comprise an upper longitudinally continuous portion that is everywhere above the inner-tier-programmable material and the outer-tier-programmable material, and forming the shared-spaced-upper-second-conductive lines to comprise a lowest portion that extends to below a bottom of the outer-tier-programmable material.

5. The method of claim 4 wherein the lowest portion does not extend to below a top of the inner-tier-programmable material.

* * * * *